United States Patent
Dial et al.

(10) Patent No.: US 9,985,193 B2
(45) Date of Patent: May 29, 2018

(54) ARCHITECTURE FOR COUPLING QUANTUM BITS USING LOCALIZED RESONATORS

(71) Applicant: International Business Machines Corporation, Armonk, NY (US)

(72) Inventors: Oliver Dial, Yorktown Heights, NY (US); Jay M. Gambetta, Yorktown Heights, NY (US); Douglas T. McClure, III, Rye, NY (US); Matthias Steffen, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 437 days.

(21) Appl. No.: 14/755,181

(22) Filed: Jun. 30, 2015

(65) Prior Publication Data
US 2017/0005255 A1    Jan. 5, 2017

(51) Int. Cl.
*G06F 17/00* (2006.01)
*H01L 39/24* (2006.01)
*H01L 39/14* (2006.01)
*B82Y 10/00* (2011.01)
*G06N 99/00* (2010.01)

(52) U.S. Cl.
CPC .............. *H01L 39/24* (2013.01); *H01L 39/14* (2013.01); *B82Y 10/00* (2013.01); *G06N 99/002* (2013.01)

(58) Field of Classification Search
CPC ......... H01L 39/24; H01L 39/14; B82Y 10/00; G06N 99/002

USPC .......................................................... 706/45
See application file for complete search history.

(56) References Cited

U.S. PATENT DOCUMENTS

| | | | |
|---|---|---|---|
| 6,535,086 | B1 | 3/2003 | Liang et al. |
| 6,897,468 | B2 | 5/2005 | Blais et al. |
| 7,135,701 | B2 | 11/2006 | Amin et al. |
| 7,932,514 | B2 | 4/2011 | Farinelli et al. |
| 8,164,082 | B2 | 4/2012 | Friesen |

(Continued)

OTHER PUBLICATIONS

International Search Report and Written Opinion, International Application No. PCT/IB2016/053010; International Filing date May 23, 2016; dated Sep. 26, 2016; pp. 1-11.

(Continued)

*Primary Examiner* — Fernando Hidalgo
(74) *Attorney, Agent, or Firm* — Cantor Colburn LLP; Vazken Alexanian

(57) ABSTRACT

A technique relates a superconducting microwave cavity. An array of posts has different heights in the cavity, and the array supports a localized microwave mode. The array of posts includes lower resonant frequency posts and higher resonant frequency posts. The higher resonant frequency posts are arranged around the lower resonant frequency posts. A first plate is opposite a second plate in the cavity. One end of the lower resonant frequency posts is positioned on the second plate so as to be electrically connected to the second plate. Another end of the lower resonant frequency posts in the array is open so as not to form an electrical connection to the first plate. Qubits are connected to the lower resonant frequency posts in the array of posts, such that each of the qubits is physically connected to one or two of the lower resonant frequency posts in the array of posts.

19 Claims, 12 Drawing Sheets

(56) References Cited

U.S. PATENT DOCUMENTS

| | | | |
|---|---|---|---|
| 8,642,998 B2 | | 2/2014 | Gambetta et al. |
| 9,818,796 B2 * | | 11/2017 | Abraham ................ H01L 27/18 |
| 9,836,699 B1 * | | 12/2017 | Rigetti ................ G06N 99/002 |
| 2013/0196855 A1 | | 8/2013 | Poletto et al. |

OTHER PUBLICATIONS

List of IBM Patents or Patent Application Treated as Related; Date Filed: Feb. 8, 2016, pp. 1-2.

Oliver Dial, et al., "Architecture for Coupling Quantum Bits Using Localized Resonators", U.S. Appl. No. 14/949,248, filed Nov. 23, 2015.

A. Blais et al., "Cavity quantum electrodynamics for superconducting electrical circuits: An architecture for quantum computation," Physical Review A, vol. 69, No. 6, 2004, 062320, 14 pages.

H. Paik et al., "Observation of high coherence in Josephson junction qubits measured in a three-dimensional circuit QED architecture," Physical Review Letters, vol. 107, No. 24, 2011, 240501, 5 pages.

M. Reagor et al., "Reaching 10 ms single photon lifetimes for superconducting aluminum cavities," Applied Physics Letters, vol. 102, No. 19, 2013, 192604, 4 pages.

T. Brecht et al., "Design and Fabrication of Novel Resonators for Scalable 3D cQED," Bulletin of the American Physical Society, Mar. 2014, Abstract T34.8.

Goryachev et al., "Creating Tuneable Microwave Media from a Two-Dimensional Lattice of Re-entrant Posts," Journal-ref: J. Appl. Phys. 118, 204504, arXiv:1509.00579, 2015, pp. 1-9.

Goryachev et al., "The 3D Split-Ring Cavity Lattice: A New Metastructure for Engineering Arrays of Coupled Microwave Harmonic Oscillators," arXiv:1408.3228v2 [physics.ins-det] Dec. 9, 2014, pp. 1-17.

\* cited by examiner

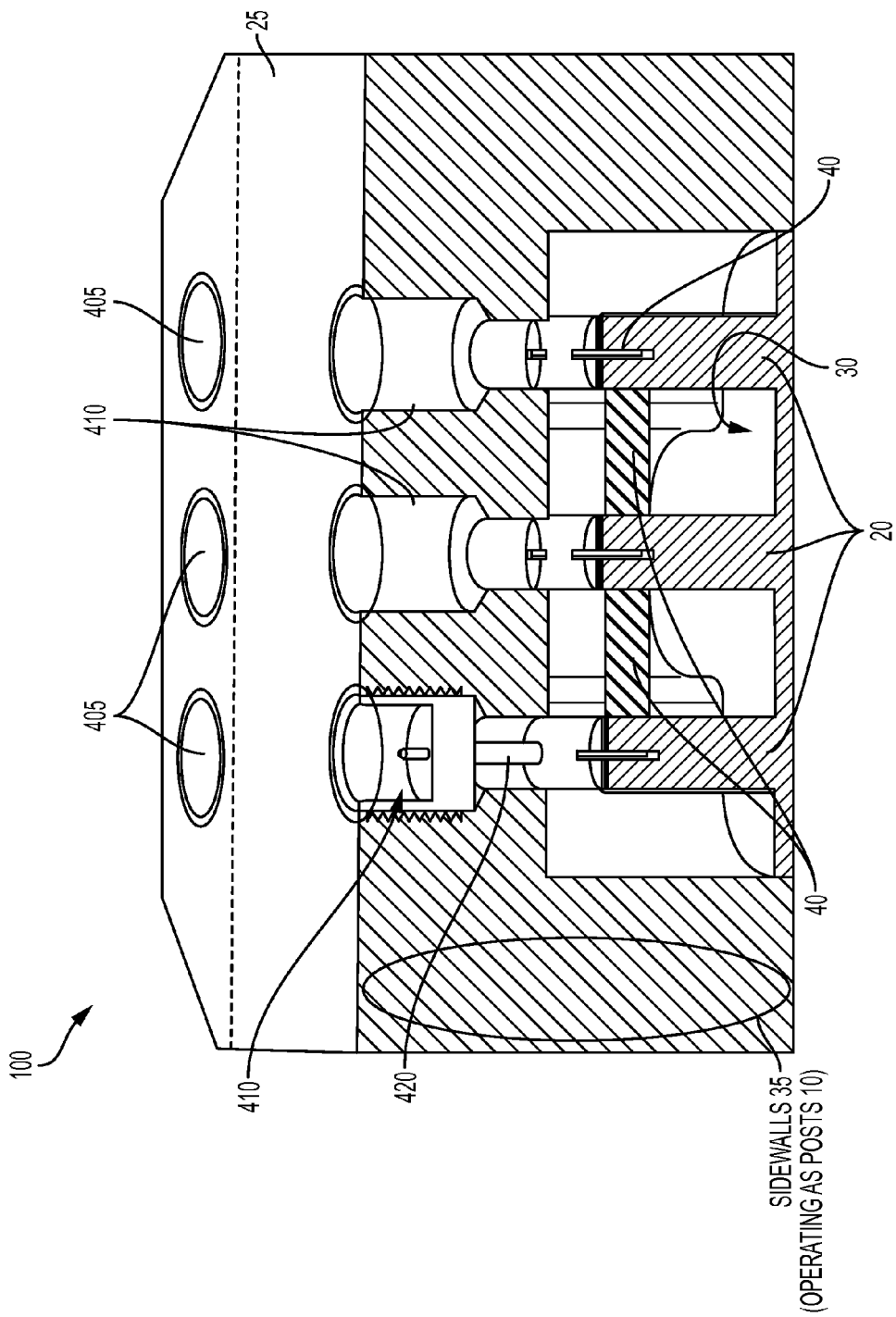

ARCHITECTURE FOR COUPLING QUANTUM BITS USING LOCALIZED RESONATORS

STATEMENT REGARDING FEDERALLY SPONSORED RESEARCH OR DEVELOPMENT

This invention was made with Government support under Contract No.: W911NF-10-1-0324 awarded by the Intelligence Advanced Research Projects Activity (IARPA). The Government has certain rights to this invention.

BACKGROUND

The present invention relates to superconducting techniques, and more specifically, to an architecture for a superconducting cavity that forms an array of resonators.

Quantum computing employs resonant structures called qubits to store information, and resonators (e.g., as a two-dimensional (2D) planar waveguide or as a three-dimensional (3D) microwave cavity) to read out and manipulate the qubits. To date, a major focus has been on improving lifetimes of the qubits in order to allow calculations (i.e., manipulation and readout) to take place before the information is lost to decoherence of the qubits. Currently, qubit coherence times can be as high as 100 microseconds and efforts are being made to increase the coherence times. A superconducting 3D cavity can be made by mating two metal pieces with pockets that line up and constitute the walls of the cavity. The cavity may be made out of copper, which limits the quality factor of all resonant modes to approximately 10,000 since copper remains a normal metal even at dilution refrigerator temperatures. Aluminum cavities of the same variety produce quality factors ranging from 1 to 50 million depending on various cleaning, machining, and material properties.

SUMMARY

According to one embodiment, a superconducting microwave cavity is provided. The cavity includes an array of posts of different heights, including lower resonant frequency posts and higher resonant frequency posts. Each post in the array supports a localized microwave mode. The higher resonant frequency posts are arranged around the lower resonant frequency posts. The cavity includes a first plate and a second plate opposite the first plate. One end of the lower resonant frequency posts in the array of posts is positioned on the second plate so as to be electrically connected to the second plate. Another end of the lower resonant frequency posts in the array of posts is open so as not to form an electrical connection to the first plate. Qubits are connected to the lower resonant frequency posts in the array of posts, such that each of the qubits is physically connected to one or two of the lower resonant frequency posts in the array of posts.

According to one embodiment, a method of configuring a superconducting microwave cavity is provided. The method includes providing an array of posts of different heights. The array of posts includes lower resonant frequency posts and higher resonant frequency posts that each support a localized microwave mode The higher resonant frequency posts are arranged around the lower resonant frequency posts. The method includes configuring a first plate opposite a second plate, and positioning one end of the lower resonant frequency posts in the array of posts on the second plate so as to be electrically connected to the second plate. The method includes positioning another end of the lower resonant frequency posts in the array of posts to be open so as not to form an electrical connection to the first plate, and connecting qubits to the lower resonant frequency posts in the array of posts, such that each of the qubits is physically connected to one or two of the lower resonant frequency posts in the array of posts.

According to one embodiment, a superconducting microwave cavity is provided. The cavity includes an enclosure including a top plate and a bottom plate connected by sidewalls, and an array of posts including lower resonant frequency posts and higher resonant frequency posts inside the enclosure. Also, the cavity include qubits connected to the lower resonant frequency posts, such that each of the qubits is physically connected to one or two of the lower resonant frequency posts in the array of posts. One end of the lower resonant frequency posts is positioned on the bottom plate so as to be electrically connected to the bottom plate, while another end of the lower resonant frequency posts is open so as not to form an electrical connection to the top plate. The higher resonant frequency posts are shorted on both ends, such that a first end of the higher resonant frequency posts is shorted to the top plate and a second end is shorted to the bottom plate. The top plate includes ports respectively above the lower resonant frequency posts, the ports being configured to couple to, drive, and measure the qubits.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing, and other features and advantages of the invention, are apparent from the following detailed description taken in conjunction with the accompanying drawings in which:

FIGS. 3A and 3B are conceptual views of aspects of the superconducting microwave resonator cavity according to an embodiment, in which:

FIG. 3A illustrates a model of the small pitch qubit array of the higher resonant frequency posts, lower resonant frequency posts, and qubits;

FIG. 3B is an abbreviated view only showing the arrangement of the qubits without the lower and higher resonant frequency posts;

FIG. 4 is a cross-sectional view of an example superconducting microwave resonator cavity illustrating input ports above the lower resonant frequency posts according to an embodiment;

DETAILED DESCRIPTION

According to embodiments, novel 3D architectures of superconducting microwave resonator cavities have been developed which allow easy coupling of multiple qubits, preserve long coherence times, reduce the qubit footprint (e.g., by up to 100 times), and is amenable to traditional machining or micromachining.

Figure 1A:
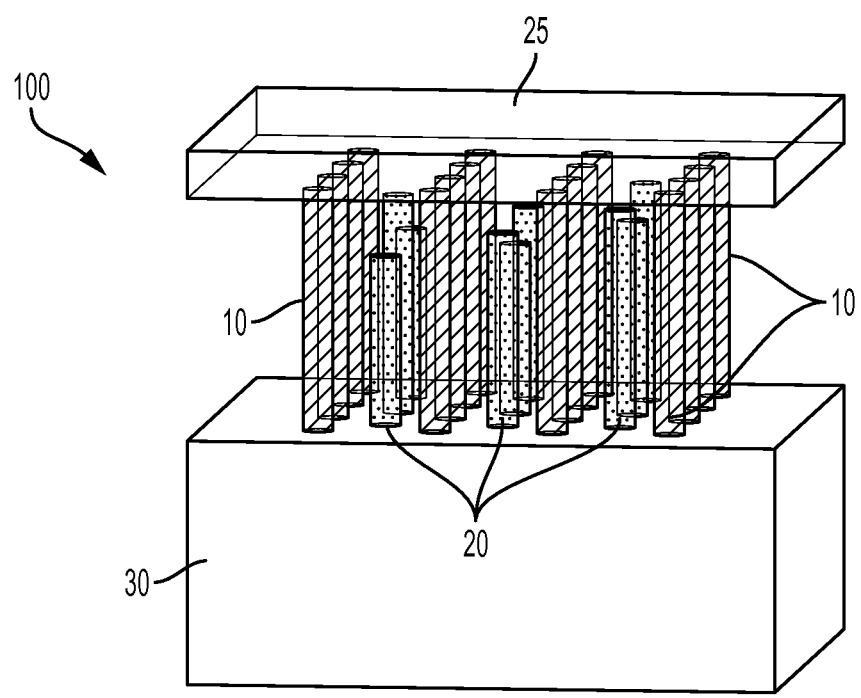
FIG. 1A illustrates a perspective view of a superconducting microwave resonator cavity, excluding qubits and sidewalls according to an embodiment.
Figure 1B:
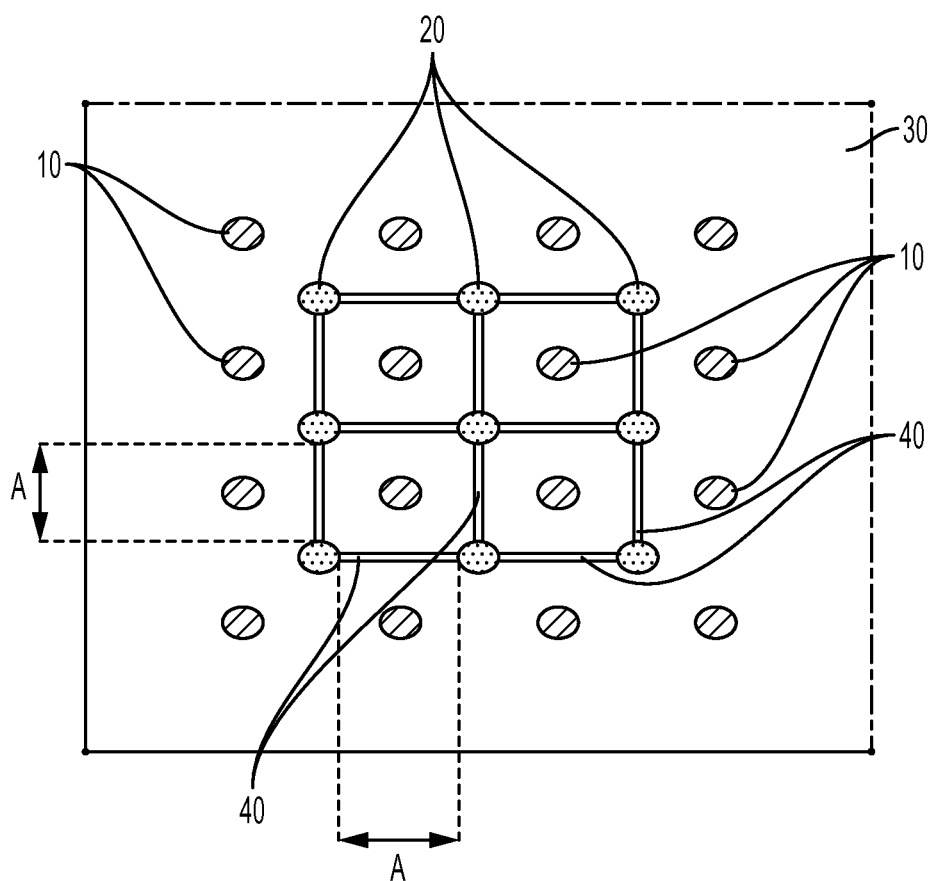
FIG. 1B illustrates a top view of the superconducting microwave resonator cavity, excluding a removable top plate according to an embodiment.
Figure 2:
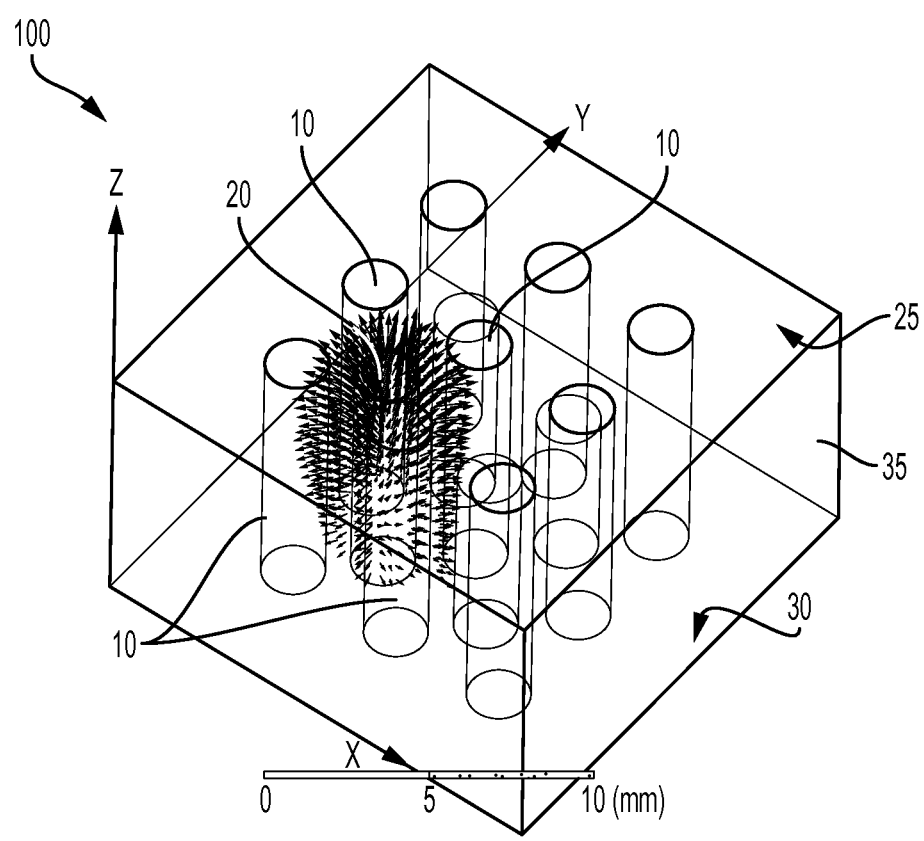
FIG. 2 is a conceptual view of the superconducting microwave resonator cavity illustrating a calculation of the electric fields associated with a lower resonant frequency post according to an embodiment.

FIG. 1A depicts a perspective view of a superconducting microwave resonator cavity 100 (without showing qubits 40), and FIG. 1B depicts a top view of the cavity 100 (with a removable top plate 25 removed) according to an embodiment. The cavity 100 includes high resonant frequency posts 10 (striped) as resonators (e.g., $\lambda/2$ resonators) and lower resonant frequency posts 20 (dotted) as resonators (e.g., $\lambda/4$ resonators). The high resonant frequency and lower resonant frequency network patterns are only illustrated for explanation purposes. The cavity 100 shows the removable top plate 25 and a bottom plate 30, but sidewalls are not shown in FIGS. 1A and 1B. Sidewalls 35 are shown in FIG. 2. The removable top plate 25, bottom plate 30, high resonant frequency posts 10, lower resonant frequency posts 20, and sidewalls 35 are all made of a superconductor material (such as, e.g., niobium, aluminum, niobium titanium, tin plated copper, titanium nitride plated copper, titanium nitride, niobium nitride, and tantalum). In one case, the material may be a non-superconducting material such as copper.

Embodiments provide a superconducting microwave resonator cavity structure 100 comprising two interpenetrating arrays of coaxial resonator posts 10 and 20 of different frequencies. The array of $\lambda/4$ resonator posts 20 has a variety of lower resonant frequencies to address individual qubits 40 with control and readout tones. The array of $\lambda/2$ resonator posts 10 has high resonant frequencies and serves to block microwave modes from propagating long distances in the cavity 100. The terms higher and lower resonant frequencies are utilized herein. It is noted that all of the higher/high resonant frequency posts 10 have a resonant frequency higher than the resonant frequency of the lower/low resonant frequency posts 20.

The 3D qubits 40 are suspended between the lower resonant frequency posts 20. For example, the qubits 40 may be held in place by a slot in the posts 20 that supports the qubits 40. In one implementation, each end of the qubit chip 40 rests on the bottom of a slot cut in the lower resonant frequency posts 20, and is held in place with indium. Because only one dimension of the lower resonator frequency posts 20 needs to be comparable to the wavelength of the radiation, the qubit density can be much larger than in the standard 3D architecture. A standard 3D cavity resonator is a box with two dimensions comparable to the wavelength, and one dimension short (or a cylindrical cavity with a radius comparable to the wavelength). However, with the lower resonant frequency posts 20, (only) the height has to be comparable to the wavelength according to embodiments. Accordingly, the qubit density can be much tighter in embodiments in contrast to the standard 3D architecture, and the post-to-post separation is arbitrary in embodiments.

The lower resonant frequency (resonator) posts 20 and/or the higher resonant frequency posts 10 may be coaxial posts (e.g., such as coaxial cable). Furthermore, qubits 40 (e.g., 3D transmon qubits) in this cavity 100 can have long coherence times. The coherence time of a qubit is denoted by $T_2$. The relaxation time of the qubit is denoted by $T_1$. The high and lower frequency resonator posts 10 and 20 may be constructed of a superconducting material in one implementation. In another implementation, the high and lower frequency resonator posts 10 and 20 may be constructed from a normal metal (e.g., non-superconducting material) such as copper.

The lower resonant frequency posts 20 are locally coupled to the qubits 40. The high resonant frequency posts 10 block the coupling between two or more individual lower resonant frequency posts 20. The high resonant frequency posts 10 keep each of the lower resonant frequency posts 20 at its own mode (i.e., each lower resonant frequency post 20 has its own lower resonant frequency). The high resonant frequency posts 10 block a lower resonant frequency post 20 from resonating to a nearby lower resonant frequency post 20. Particularly, the high resonant frequency posts 10 prevent the lower resonant frequency posts 20 from coupling to any/all other lower frequency posts 20. In addition to isolating the resonating frequency of each lower resonant frequency post 20 from coupling to another lower resonant frequency post 20, the high resonant frequency posts 10 connect to (and mechanically support) the top plate 25 and the bottom plate 30.

According to an embodiment, FIG. 2 is a conceptual view of the cavity 100 illustrating a calculation of the electric fields (shown by arrows) associated with one of the lower resonant frequency posts 20 ($\lambda/4$), which shows mode localization of the lower resonant frequency posts 20 ($\lambda/4$). FIG. 2 is a rendering of a particular implementation of this 3D architecture. In FIG. 2, each lower resonant frequency post 20 forms a resonator which may be coupled to a qubit 40 (not shown in FIG. 2 for the sake of clarity). Qubits 40 can be placed between the lower resonant frequency posts 20, and each qubit 40 only couples strongly to the modes of the lower resonant frequency posts 20 that the qubit 40 is immediately adjacent to.

As noted above, the short lower resonant frequency posts 20 have one end shorted to the base plate 30 while the other end of the short lower resonant frequency posts 20 is open in free space (i.e., open in the cavity 100). These lower resonant frequency posts 20 (form $\lambda/4$ resonators) and have low resonant frequencies given by roughly c/4d where c is the speed of light and d is the height of the lower resonant frequency posts 20. Long higher resonant frequency posts 10 have both ends shorted to the base plate 30 and top plate 25 of the enclosed cavity 100. These plates 25 and 30 perform the conceptual role of the shield in a coaxial resonator. Within embodiments, the long higher resonant frequency posts 10 (form λ/2 resonators) with high resonant frequencies given by c/2h where h is the height of the cavity 100. Provided that the short lower resonant frequency posts 20 are at least half the height of the cavity 100, the long higher resonant frequency posts 10 correspondingly have higher resonant frequencies than the short lower resonant frequency posts 20. The high resonant frequency posts 10 keep the modes of the short lower resonant frequency posts 20 well-localized, allowing addressability of individual qubits 40. This localization of the mode (resonant frequency) of this particular lower resonant frequency post 20 theoretically shows the localization of the electric field arrows for this particular lower resonant frequency post 20 in FIG. 2.

Figure 3A:
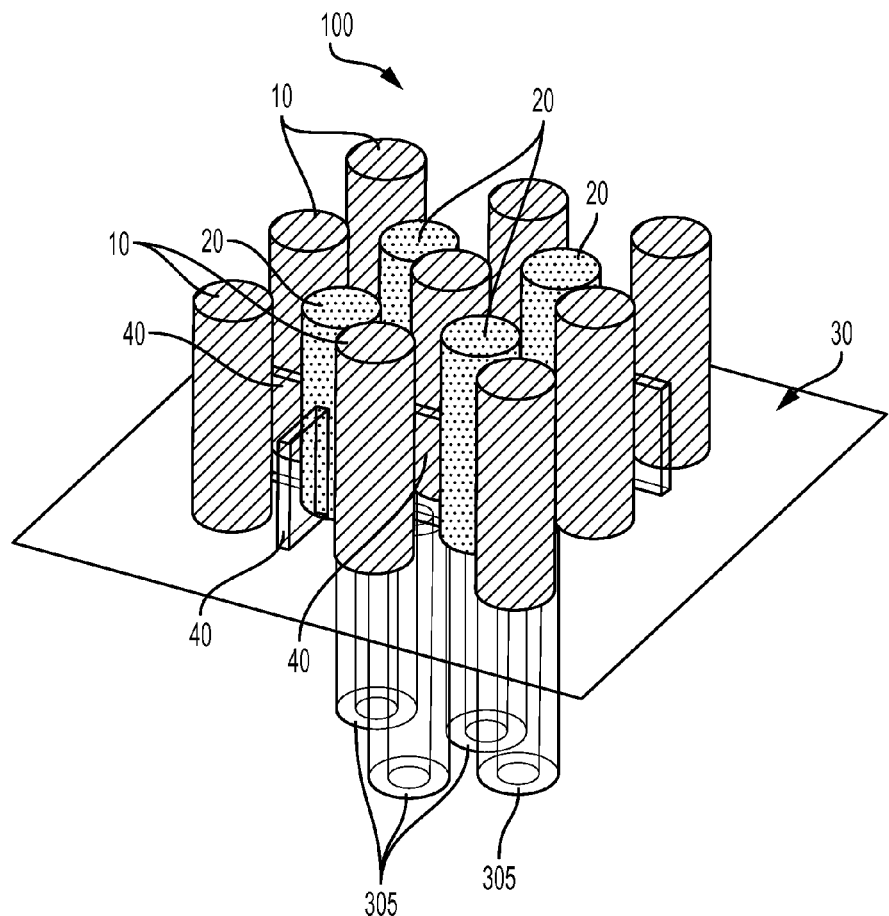
Figure 3B:
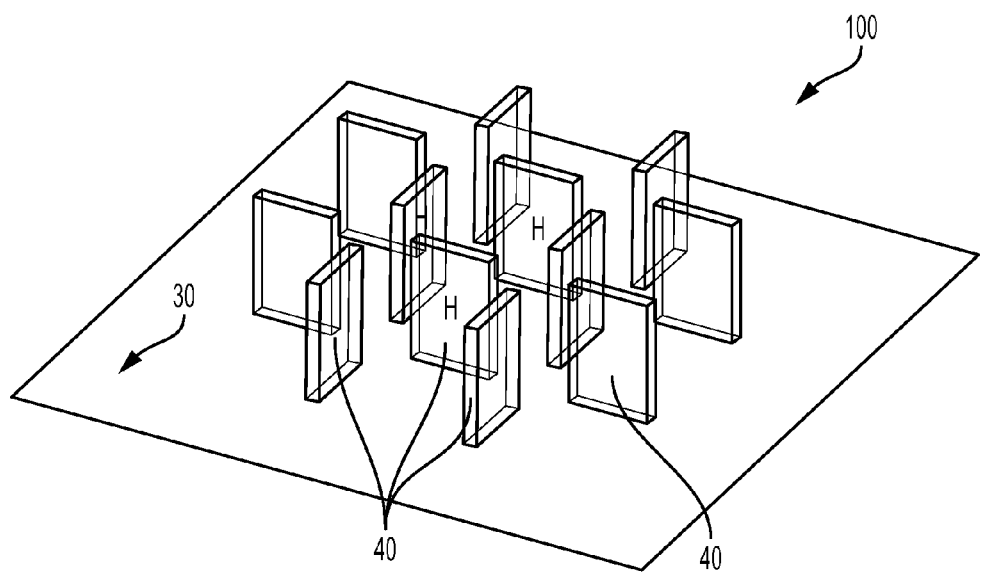

FIGS. 3A and 3B illustrate conceptual views of aspects in the cavity 100 according to an embodiment. FIG. 3A illustrates a model of the small pitch qubit array of the higher resonant frequency posts 10, the lower resonant frequency posts 20, and the qubits 40 connected to the lower resonant frequency posts 20. FIG. 3B is an abbreviated view only showing the arrangement of the qubits 40 without attachment to the lower resonant frequency posts 20 and without the higher resonant frequency posts 10.

Note that only the height of the higher resonant frequency posts 10 and the height of the lower resonant frequency posts 20 controls their respective resonator frequency. Consequently, the diameter and separation of the higher resonant frequency posts 10 and lower resonant frequency posts 20 can be selected arbitrarily to ease fabrication, to control the magnitude of the electric field in the mode coupling to the qubit 40, and/or to scale the devices. FIG. 3 shows the qubits 40 in a post array (of posts 10 and 20). In FIG. 3A, an additional cylindrical resonator 305 may also be machined beneath each qubit 40 for readout and control. The cylindrical resonators 305 extend through the bottom plate 30 almost reaching the qubit 40. For readout and control, a cylindrical resonator 305 allows microwave pulses directed at an individual qubit 40 above it, and measuring the frequency of this resonator 305 correspondingly measures the state of only the qubit 40 above it. In particular, microwave pulses/tones applied at the qubit (resonant) frequency will manipulate the particular qubit 40 (above the corresponding cylindrical resonator 305), while microwave pulses applied near the resonant frequency of the cylindrical resonator 305 will measure the qubit 40.

The cylindrical resonators 305 have a pin extending up through the middle of the cylindrical resonators 305. The pin comes close to the qubit 40 but does not touch the qubit 40. Each pin and/or cylindrical resonator 305 may be capacitively coupled to the qubit 40. In one implementation, the distance from the qubit 40 to the pin may be approximately 1/10 the size of the qubit 40. The cylindrical resonators 305 and the pins may be made of a superconducting material such as aluminum and niobium. In another case, the cylindrical resonators 305 and the pins may be made of copper. In one case, the pin may be secured with a dielectric plug on the edge of the cavity. An example implementation would be the center pin of a subminiature push-on (SMP) connector.

The cylindrical resonators 305 are not shown in FIG. 3B for simplicity. Although not shown for conciseness, the lower resonant frequency posts 20 are to be positioned at the ends of each qubit 40, such that each qubit 40 is connected (attached and touching) to two lower resonant frequency posts 20 at each end. That is, one horizontal end of the qubit 40 is connected to a lower resonant frequency post 20 and the other horizontal end is connected to a different lower resonant frequency post 20. Note that moving the qubit 40 vertically up lower resonant frequency posts 20 increases the coupling of the qubit 40 to the attached lower resonant frequency posts 20. Conversely, moving the qubit 40 vertically down the lower resonant frequency posts decreases the coupling of the qubit 40 to the attached (two) lower resonant frequency posts 20.

FIG. 4 is a cross-sectional view of an example cavity 100 in which input ports 405 above the lower resonant frequency posts 20 may couple selectively to the respective modes (of the lower resonant frequency posts 20) according to an embodiment. FIG. 4 depicts input ports 405, individually coupling its own lower frequency resonator post 20, disposed in the top plate 25. The coupling strength, as measured by the external quality factor $Q_e$, can be controlled by modifying the input port 405 in any manner understood by one skilled in the art. Each of the input ports 405 is an entrance (in the top plate 25) to individual microwave cylinder connectors 410 which are above respective lower resonant frequency posts 20. The left-most input port 405 is illustrated as a cross-section view that shows a larger extension 420 within the input port 405.

The individual microwave cylinder connectors 410 are capacitively coupled to the individual lower resonant frequency posts 20. In FIG. 4, it is noted that some qubits 40 extend in and out of the page of the drawing to connect with another lower resonant frequency post 20.

In FIG. 4, the higher resonant frequency posts 10 are implemented as sidewalls 35 of the cavity 100. The sidewalls 35 operate to localize the mode of the lower resonant frequency posts 20 when five or fewer lower resonant frequency posts 20 are utilized. For example, the sidewalls 35 (operating as higher resonant frequency posts 10) prevent the lower resonant frequency posts 20 from coupling to other resonant frequency posts 20.

Figure 5:
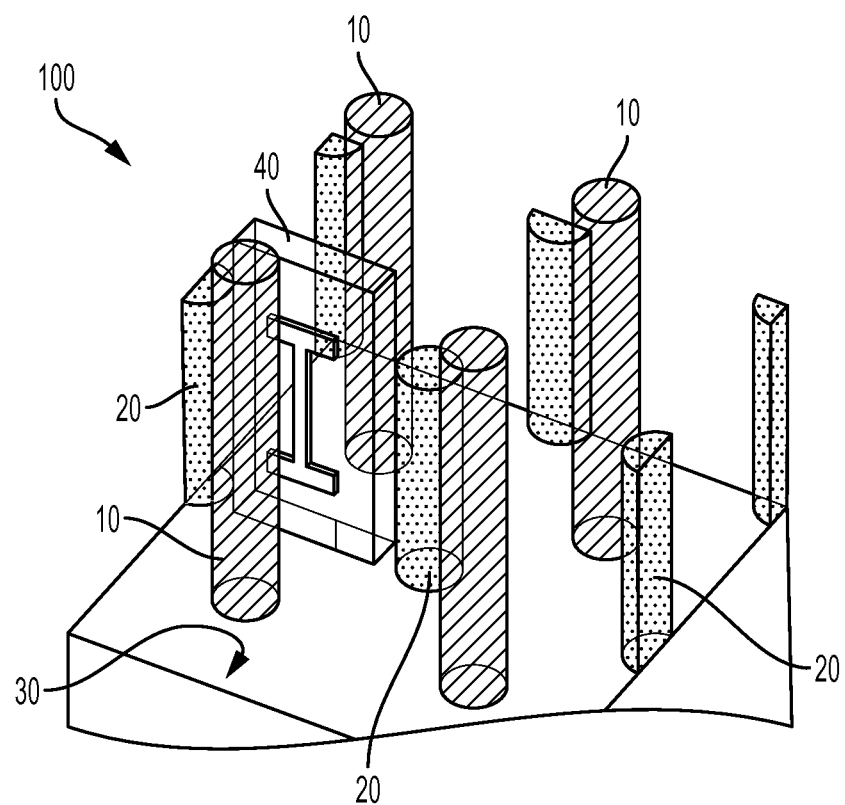
FIG. 5 is an abbreviated view of the superconducting microwave resonator cavity according to an embodiment.
Figure 6:
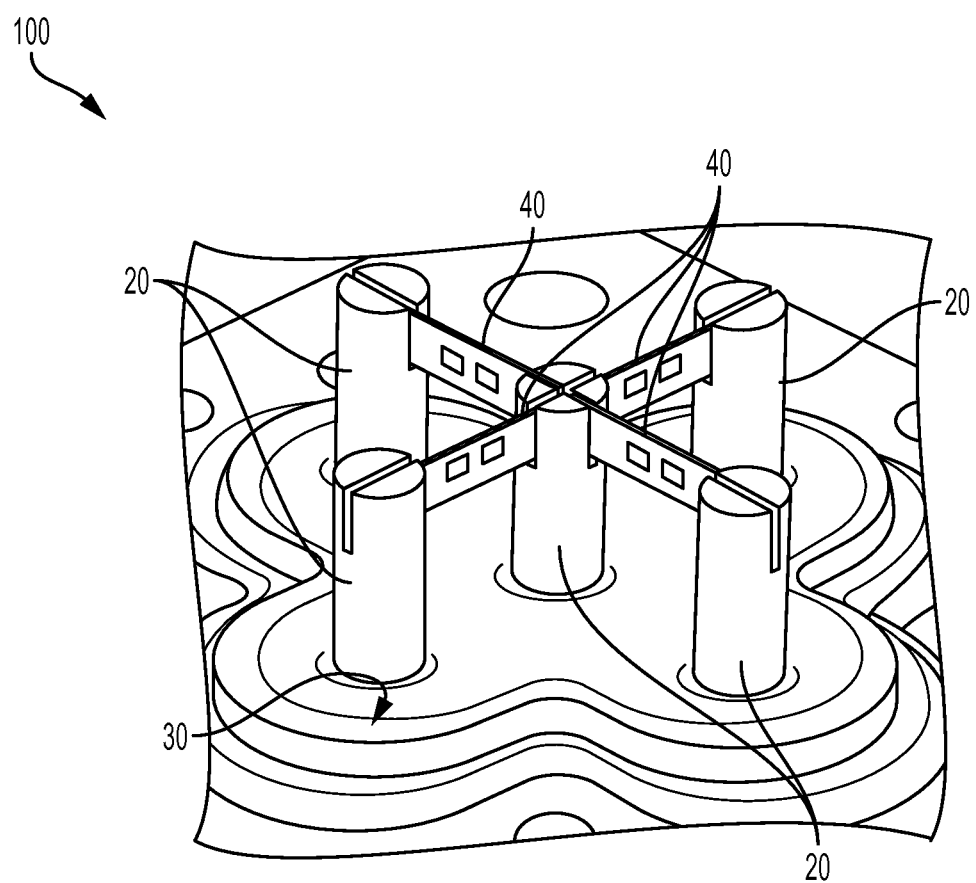
FIG. 6 is an abbreviated view of the superconducting microwave resonator cavity illustrating qubits attached perpendicularly to the lower resonant frequency posts according to an embodiment.

FIG. 5 illustrates an abbreviated view of the cavity 100 according to an embodiment. FIG. 5 shows an example with just a single qubit 40 for ease of description, but it will be understood that the present example also applies to multiple qubits 40. FIG. 5 shows that the qubits 40 can be added parallel to the lower resonant frequency posts 20. The parallel positioning shows that the length (longest direction) of the qubit 40 is pointed vertically in the cavity. According to an embodiment, FIG. 6 is an abbreviated view that shows qubits 40 perpendicular to the lower resonant frequency posts 20 at the tip where the field gradient is largest depending on the coupling strength needs and/or geometric constraints. Particularly, FIG. 6 is an example embodiment only showing the lower resonant frequency posts 20 while the higher resonant frequency posts 10 are implemented in the sidewalls of the cavity 100 as discussed in FIG. 4.

Figure 7:
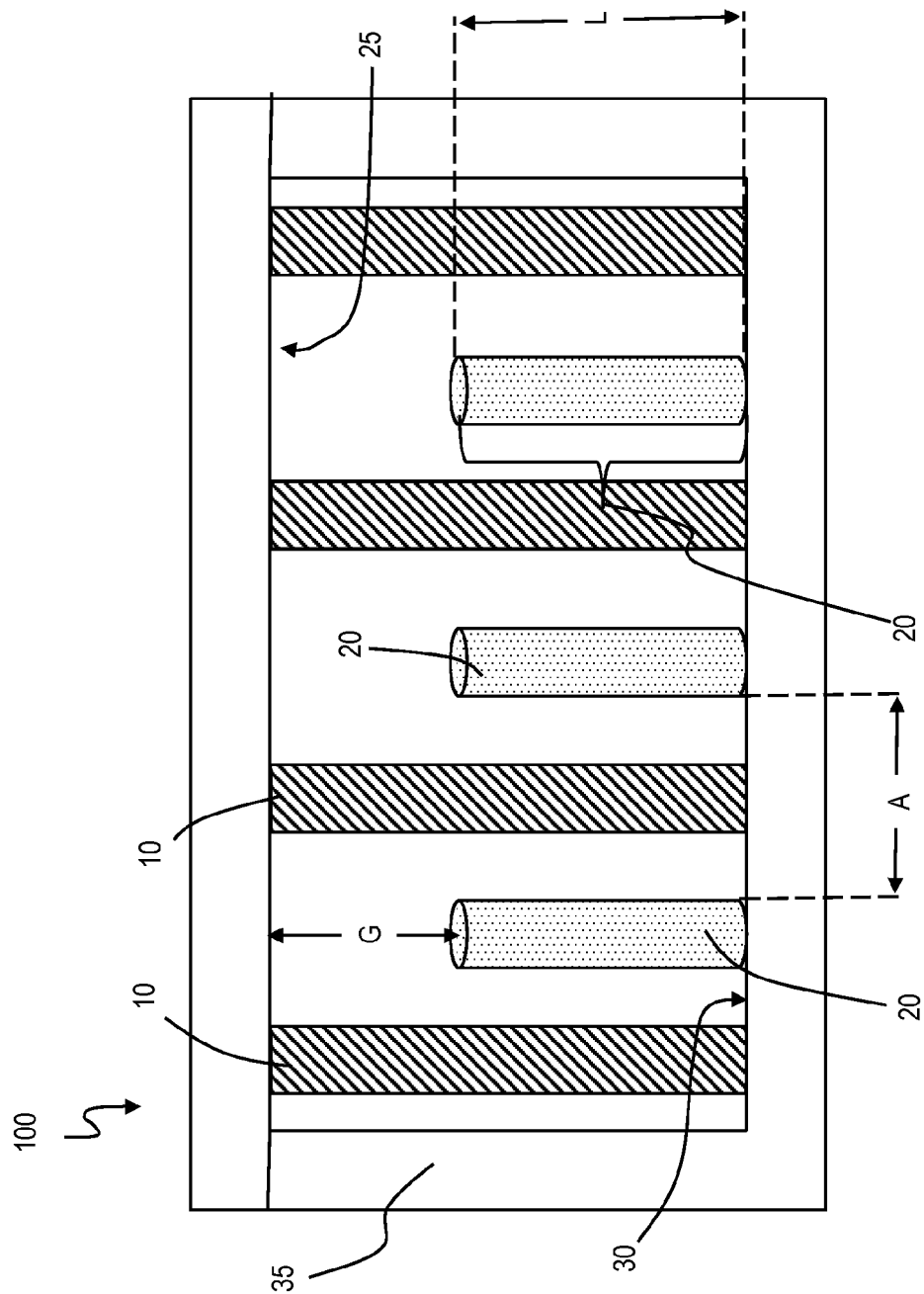
FIG. 7 is an abbreviated view of the superconducting microwave resonator cavity illustrating that the coupling strength of a lower resonant frequency post to a given qubit is controlled by the post-to-post separation between the lower resonant frequency posts according to an embodiment.

According to an embodiment, the parameters of the cavity 100 can be easily tuned. For example, FIG. 7 is an abbreviated view of the cavity 100 illustrating that the coupling strength of a lower resonant frequency post 20 to a given qubit 40 (not shown) is controlled by the post-to-post separation A between the lower resonant frequency posts 20, which controls the strength of the electric field in the resonator modes. This post-to-post separation A is to be smaller than the length of the shortest post (e.g., smaller than the length of the lower resonant frequency post 20). The coupling strength between a qubit and resonator, typically quantified as the dot product of the resonator's electric field and the qubit's effective dipole moment, affects the degree to which the presence of the qubit perturbs the frequency of the resonator.

As another parameter, the external quality factor of the resonator modes (of the lower resonant frequency posts 20) is controlled by the gap G between the top of the lower resonant frequency posts 20 and the input ports 405. The larger the gap G, the larger the external quality factor. The external quality factor is the ratio of the resonator frequency to the rate at which the resonator loses energy by coupling to the environment, as understood by one skilled in the art; hence larger external quality factors correspond to weaker external coupling strengths. The resonant frequency of the resonator modes is controlled by the length L of the lower resonant frequency posts 20.

Isolation of the resonant frequency of the lower resonant frequency posts 20 is controlled by the resonant frequency of the higher resonant frequency ($\lambda/2$) posts 10.

Figure 8:
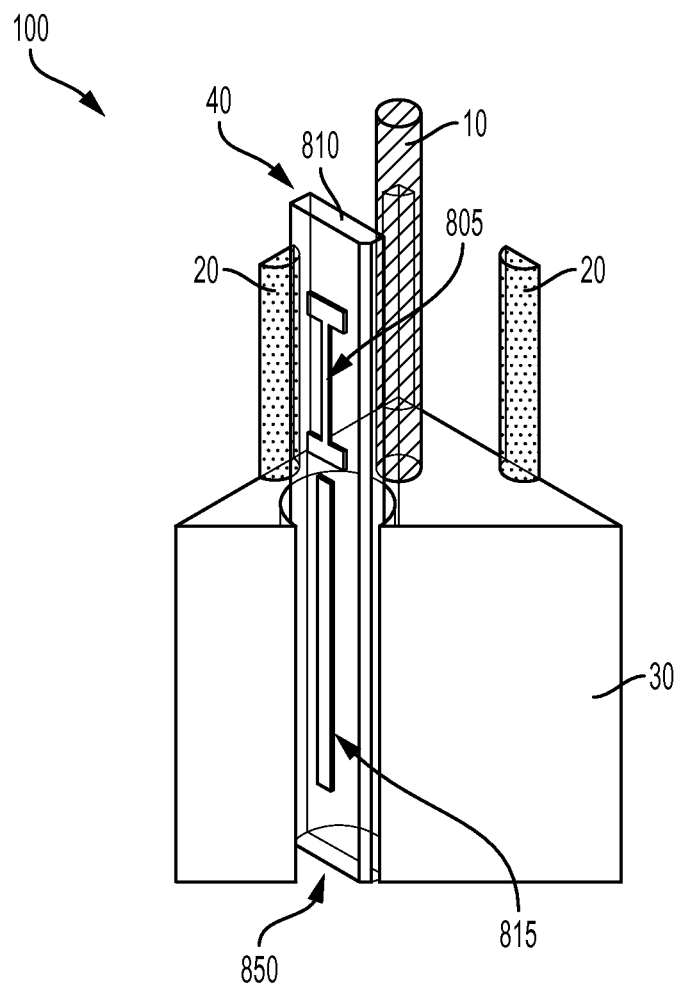
FIG. 8 illustrates details of one implementation of the superconducting microwave resonator cavity according to an embodiment.

FIG. 7 shows that the enclosure includes the top plate 25, the bottom plate 30, and sidewalls 35, each of which is made of a superconducting material in one implementation. Although understood to be present, for simplicity the qubits 40 are not shown connected to the lower resonant frequency posts 20, and cylindrical resonators 305 are not shown aligned directly under the qubits 40 (as shown in FIGS. 3A, 4, and 8). Although omitted for the sake of clarity, it is understood that the top plate 25 includes the input ports 405 directly above the lower resonant frequency posts 20 (as shown in FIG. 4).

FIG. 8 illustrates details of one implementation of the superconducting microwave resonator cavity 100 according to an embodiment. Only an abbreviated portion of the superconducting microwave resonator cavity 100 is shown. As discussed herein, each qubit 40 is attached to two lower resonant frequency ($\lambda/4$) posts 20, while the higher resonant frequency ($\lambda/2$) posts 10 are positioned around the lower resonant frequency ($\lambda/4$) posts 20. FIG. 8 shows the bottom plate 30 with a cut-away view inside a cylindrical hole 850 in the bottom plate 30. The qubit 40 is a chip that has a transmon 805 formed on a substrate 810. The substrate 810 may be sapphire, silicon, etc. Attached to or formed on the substrate 810 may be a microfabricated microstrip resonator 815 (i.e., readout resonator) for readout of the qubit 40 positioned directly above the cylindrical hole 850. Part of the substrate 810 extends down into the cylindrical hole 850 and this part contains the microfabricated microstrip resonator 815. The other part of the substrate 810 is above (and not in) the cylindrical hole 850, and this part contains the transmon 805. The microfabricated microstrip resonator 815 serves the same role as the center piece in the cylindrical resonator 305.

The transmon 805 is a type of superconducting charge qubit that is designed to have reduced sensitivity to charge noise. Its name is an abbreviation of the term transmission line shunted plasma oscillation qubit. The transmon achieves its reduced sensitivity to charge noise by increasing the ratio of the Josephson energy to the charging energy. The transmon 805 is explicitly shown in the qubit 40 of FIG. 8. It is understood that the transmon 805 is present in the other qubits 40 in the other figures, although explicit identification of the transmon 805 has been omitted for the sake of clarity in other figures.

Although FIG. 8 only shows a single qubit 40 extended into a single cylindrical hole, it is understood that numerous qubits 40 respectively extend into their own individual cylindrical hole 850.

Figure 9B:
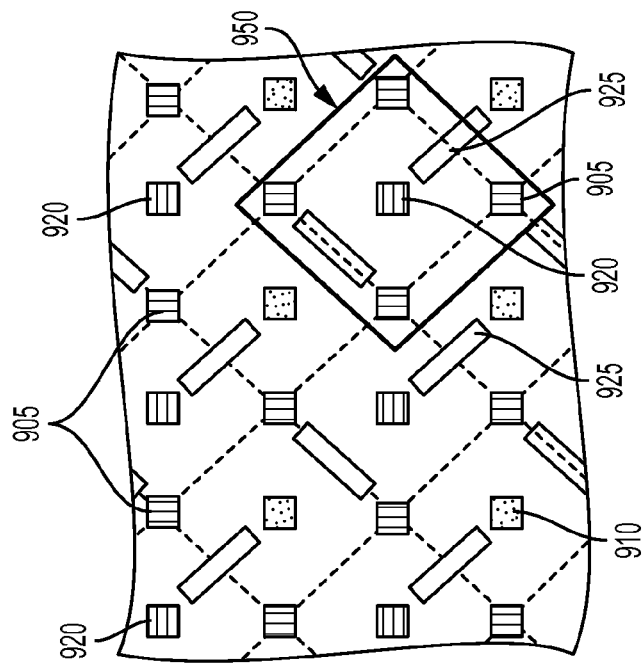
FIG. 9B illustrates a resonator-based implementation of the lattice shown in FIG. 9A.
Figure 9A:
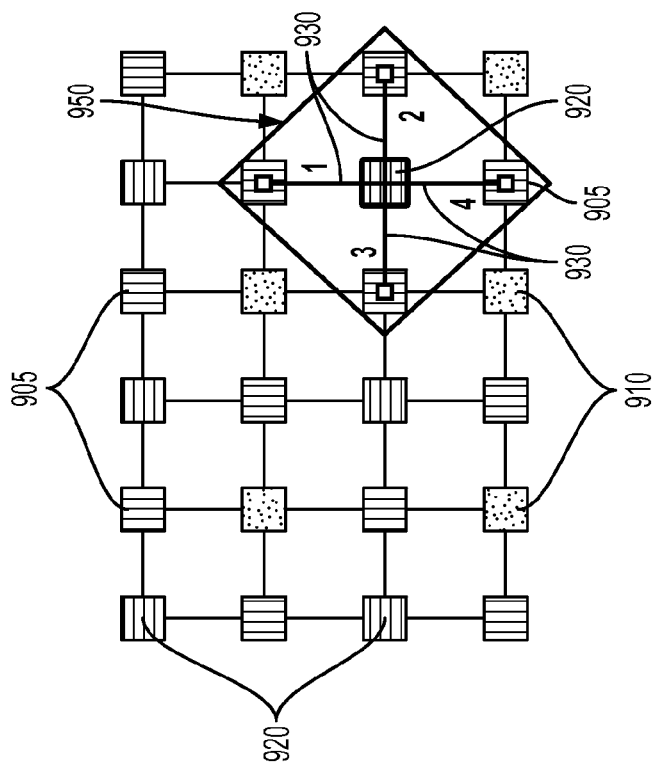
FIG. 9A illustrates a section of a square array of qubits for the surface code error correcting scheme.

In the context of fault-tolerant quantum computation, embodiments can be utilized for implementing quantum error correcting schemes, such as the surface code. In the state-of-the art, the surface code quantum error correcting scheme requires the ability to couple each qubit to its four nearest-neighbor qubits, as illustrated in FIG. 9A. In this paradigm, "data" qubits 905 (vertical line pattern) are used for carrying out the desired computation, while dotted pattern "ancilla" qubits 910 and horizontal pattern "ancilla" qubits 920 are entangled with the data qubits 905 so as to detect bit- and phase-flip errors, respectively. FIG. 9B is a state-of-the-art approach for implementing the required connectivity that involves coupling each data qubit 905 to two "bus" resonators 925, each of which mediates the interactions among the four qubits connected to it. Note that each qubit effectively has six nearest neighbors in this configuration (i.e., the other three qubits coupled to each of the two bus resonators 925), but it needs to only couple to four of them. Further details about this arrangement can be found in U.S. Patent Application US20140264283, which is herein incorporated by reference.

FIG. 9A shows a section of a square array of qubits that is utilized for the surface code error correcting scheme. As noted above, the vertical line pattern qubits 905 represent data qubits. The dotted pattern qubits 910 and the horizontal line pattern qubits 920 represent ancilla qubits for checking the X/Z parity of the four surrounding data qubits. Lines 930 connect pairs of qubits that can be coupled with an entangling operation. The square 950 indicates a single parity-check "plaquette," within which the numbers indicate the order of entangling operations between the ancilla qubit 920 (center) and the four surrounding data qubits 905. During normal operation, this cycle of operations is run on every plaquette 950 simultaneously (it is understood that there are other plaquettes 950). An example entangling operation is the controlled-NOT (CNOT) gate, which flips the state of the "target" qubit if and only if the "control" qubit is in the |1> state; here, this operation is represented by a line with a solid circle at one end to indicate the control qubit and a circled cross at the other end to indicate the target qubit. FIG. 9B illustrates a resonator-based implementation of the lattice shown in FIG. 9A. In FIG. 9B, each qubit couples to the nearest two bus resonators 925, shown here as thick lines (or rectangles). The square again highlights a single plaquette 950, consisting of a central ancilla qubit 920 coupled to a total of four data qubits 905 via two buses 925.

Given a network of qubits coupled in this fashion, error correction is accomplished by repeatedly running the following set of operations on each five-qubit plaquette 950 simultaneously:

1) Prepare the ancilla in the |0> state. To date this has typically been accomplished by waiting for the qubit to relax on its own, but with high-fidelity measurement and feedback, it is also possible to simply measure the state of the qubit and then apply a control pulse if needed to return it to the |0> state.

2) Entangle the ancilla with its four adjacent data qubits. For superconducting qubits, examples of entangling gates include cross-resonance and resonator-induced phase gates. Half of the ancillas (i.e., either the "dotted pattern" or "horizontal" ones depending on details of the implementation) should have Hadamard gates applied to them before and after the entangling gate.

3) Measure the state of the ancilla. It is assumed in this document that each qubit is also coupled to a third resonator via which its state can be read out. (It is noted that embodiments discussed herein are to be compatible with the addition of a readout resonator for each qubit.)

4) Determine the most likely set of errors. This step is expected to involve the use of classical graph matching algorithms. However, the details are beyond the scope of this document.

5) Apply corrections as needed. Adjust the qubit control pulses as needed to correct the errors inferred from the previous step.

6) Assuming the fidelities of single-qubit and two-qubit (entangling) gates are above certain thresholds, it has been shown that the rate of uncorrected errors is strongly suppressed as a function of the circuit size (i.e., number of qubits) on which this algorithm is run. Note that this algorithm simply allows a fault-tolerant "logical" qubit to be constructed from a set of imperfect physical qubits. Possible methods for executing logical operations on such a system are beyond the scope of this document.

Figure 10:
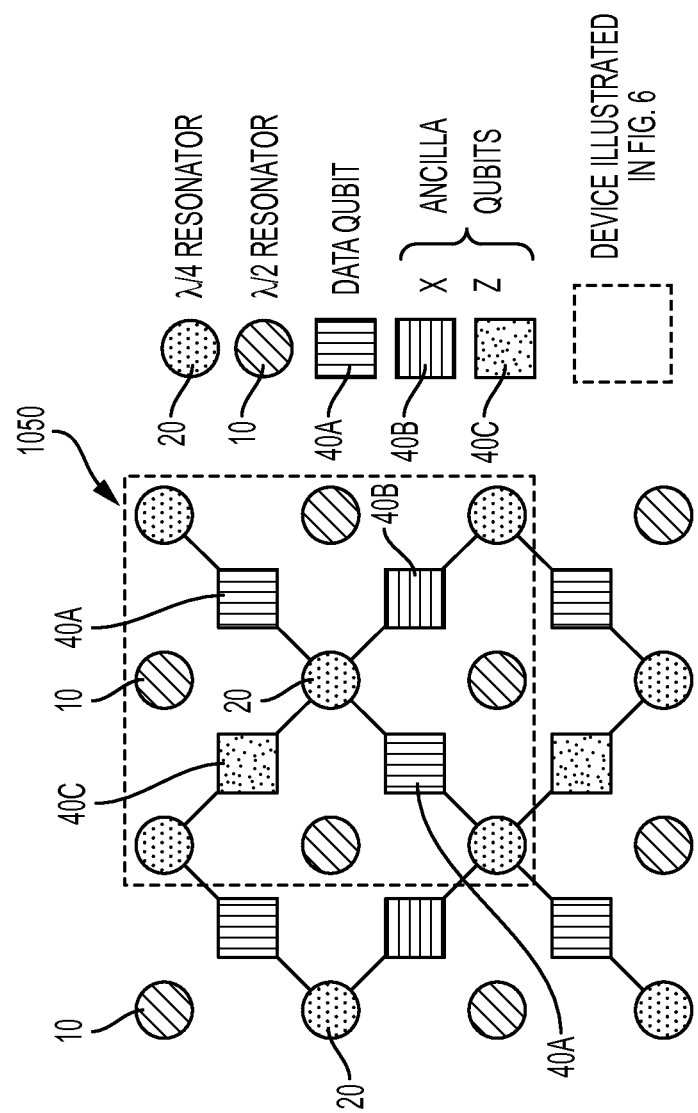
FIG. 10 illustrates that the qubit-resonator network of FIG. 9B can be implemented using the features of the present disclosure according to an embodiment.

According to an embodiment, FIG. 10 illustrates that the exact qubit-resonator network of FIG. 9B can be implemented using the features of the present disclosure, with the $\lambda/4$ resonators 20 serving as buses to couple neighboring qubits 40. A proof-of-concept device containing five $\lambda/4$ resonators 20 and four qubits 40, corresponding to the network inside the dashed box 1050 in FIG. 10, has been produced and characterized. The measured qubit and resonator parameters were in the range expected from past measurements and simulations, proving that this embodiment works as intended. Note that the proof-of-concept device in FIG. 6 omits the $\lambda/2$ resonators 10 since the aluminum sidewalls 35 of the enclosure perform the same function, i.e., localizing modes to reduce crosstalk. However, any larger device may require $\lambda/2$ resonators 10 in another implementation.

Returning back to FIG. 10, the schematic diagram shows how a qubit-resonator network suitable for quantum error correction could be implemented using the present disclosure. The $\lambda/4$ resonators 20 serve as bus resonators that couple qubits 40 together, while the $\lambda/2$ resonators 10 serve to reduce crosstalk. The qubits are delineated as data qubits 40A, ancilla qubits 40B (utilized for X parity checks), and ancilla qubits 40C (utilized for Z parity checks).

While the proof-of-concept device in FIG. 6 may be too small to demonstrate error correction with the surface code, it is able to be used to demonstrate X and Z parity check operations, which are then utilized for a full error correction demonstration. Details of a single parity-check operation performed on a superconducting qubit device in the 2D coplanar architecture are reported in the state-of-the art. A similar demonstration is able to be performed using the proof-of-concept device in FIG. 6.

It is noted that the example application described herein is only one example of how one might use the present disclosure to perform quantum error correction. It may also be useful for implementing other error correcting schemes, either existing or not yet designed, as well as for other purposes.

Figure 11:
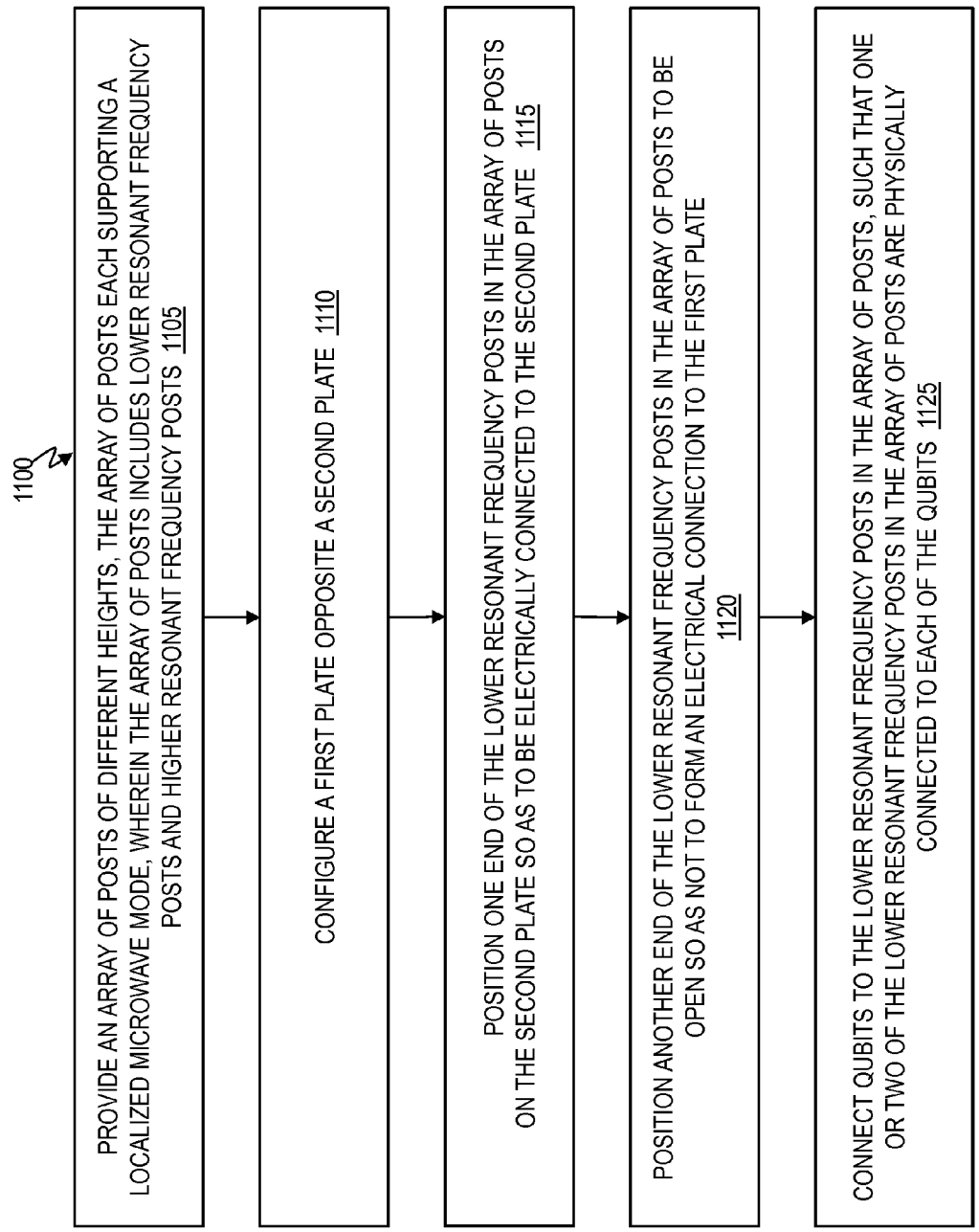
FIG. 11 is a flow diagram illustrating a method of configuring a superconducting microwave cavity according to an embodiment.

FIG. 11 illustrates a method of configuring a superconducting microwave cavity 100 according to an embodiment.

At block 1105, an array of posts of different heights is provided, and the array of posts each supports a localized microwave mode, where the array of posts includes lower resonant frequency posts 20 and higher resonant frequency posts 10.

At block 1110, a first plate (e.g., top plate 25) is configured to be opposite a second plate (e.g., bottom plate 30).

At block 1115, one end of the lower resonant frequency posts 20 in the array of posts is positioned on the second plate 30 so as to be electrically connected to the second plate 30.

At block 1120, the other end of the lower resonant frequency posts 20 in the array of posts is to be open so as not to form an electrical connection to the first plate 25.

At block 1125, the qubits 40 are connected to the lower resonant frequency posts 20 in the array of posts, such that one or two of the lower resonant frequency posts 20 in the array of posts are physically connected to each of the qubits 40. In one implementation, each lower resonant frequency post 20 is configured to capacitively couple to the qubit 40 connected to that particular lower resonant frequency post 20.

The first plate 25 includes ports 405 respectively above each of the lower resonant frequency posts 20 in the array of posts, and the ports 405 are configured to couple to, drive, and measure the qubits 40.

The higher resonant frequency posts 10 are shorted on both ends, such that a first end of the higher resonant frequency posts 10 is shorted to the first plate 25 and a second end is shorted to the second plate 30. The higher resonant frequency posts 10 are configured to provide mode localization for the lower resonant frequency posts 20 in the array of posts.

The qubits 40 are at least one of superconducting qubits, semiconductor spin qubits, optically trapped ions, and an impurity center in a crystal.

In one case, the qubits 40 are of different types on a same lattice.

Each of the qubits 40 respectively incorporates its own readout resonator (e.g., microstrip resonator 815). The readout resonator (microstrip resonator 815) extends into cylindrical resonators 305 formed through the second plate 30, and the cylindrical resonators 305 are positioned respectively under each of the qubits 40 to receive the readout resonator 815. Reference can be made to FIGS. 3A and 8.

In one implementation, the array of posts forms a square lattice. In another implementation, the array of posts forms a triangular lattice.

The lattice of the qubits 40 is configured to perform a quantum error correcting code, as shown in FIGS. 6 and 10 according to an embodiment.

The array of posts is fabricated using at least one of standard machining techniques, standard micromachining techniques, and 3D printing.

The array of posts has different heights between 0.5 mm and 100 mm in length, corresponding to supporting resonating modes from 0.75 GHz to 150 GHz. The separation distance (e.g., distance A) between the lower resonant frequency posts 20 in the array of posts is smaller than the heights (e.g., length L) of the lower resonant frequency posts 20. It is noted that the height of the higher resonant frequency posts 10 is greater than the height of the lower resonant frequency posts 20.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A superconducting microwave cavity, comprising:
an array of posts of different heights, the array of posts each supporting a localized microwave mode, wherein the array of posts includes lower resonant frequency posts and higher resonant frequency posts, the higher resonant frequency posts arranged around the lower resonant frequency posts;
a first plate; and
a second plate opposite the first plate;
wherein one end of the lower resonant frequency posts in the array of posts is positioned on the second plate so as to be electrically connected to the second plate;
wherein another end of the lower resonant frequency posts in the array of posts is open so as not to form an electrical connection to the first plate; and
wherein qubits are connected to the lower resonant frequency posts in the array of posts, such that each of the qubits is physically connected to one or two of the lower resonant frequency posts in the array of posts.

2. The cavity of claim 1, wherein the first plate includes ports respectively above the lower resonant frequency posts in the array of posts, the ports being configured to couple to, drive, and measure the qubits.

3. The cavity of claim 1, wherein the higher resonant frequency posts are shorted on both ends, such that a first end of the higher resonant frequency posts is shorted to the first plate and a second end is shorted to the second plate.

4. The cavity of claim 3, wherein the higher resonant frequency posts are configured to provide mode localization for the lower resonant frequency posts in the array of posts.

5. The cavity of claim 1, wherein the qubits are at least one of superconducting qubits, semiconductor spin qubits, optically trapped ions, and an impurity center in a crystal.

6. The cavity of claim 1, wherein the qubits are of different types on a same lattice.

7. The cavity of claim 1, wherein each of the qubits respectively incorporates its own readout resonator.

8. The cavity of claim 7, wherein the readout resonator extends into cylindrical resonators formed through the second plate, the cylindrical resonators being positioned respectively under each of the qubits to receive the readout resonator.

9. The cavity of claim 1, wherein the array of posts forms a square lattice.

10. The cavity of claim 1, wherein the array of posts forms a triangular lattice.

11. The cavity of claim 1, wherein a lattice of the qubits is configured to perform a quantum error correcting code.

12. The cavity of claim 1, wherein the array of posts is fabricated using at least one of standard machining techniques, standard micromachining techniques, and 3D printing.

13. The cavity of claim 1, the array of posts having different the heights are between 0.5 mm and 100 mm in lengths, corresponding to supporting resonating modes from 0.75 GHz to 150 GHz.

14. The cavity of claim 1, wherein a separation distance between the lower resonant frequency posts in the array of posts is smaller than the heights of the lower resonant frequency posts.

15. A superconducting microwave cavity comprising:
an enclosure including a top plate and a bottom plate connected by sidewalls;
an array of posts including lower resonant frequency posts and higher resonant frequency posts inside the enclosure; and
qubits connected to the lower resonant frequency posts, such that each of the qubits is physically connected to one or two of the lower resonant frequency posts in the array of posts;
wherein one end of the lower resonant frequency posts is positioned on the bottom plate so as to be electrically connected to the bottom plate, while another end of the lower resonant frequency posts is open so as not to form an electrical connection to the top plate;
wherein the higher resonant frequency posts are shorted on both ends, such that a first end of the higher resonant frequency posts is shorted to the top plate and a second end is shorted to the bottom plate; and
wherein the top plate includes ports respectively above the lower resonant frequency posts, the ports being configured to couple to, drive, and measure the qubits.

16. The cavity of claim 15, wherein the higher resonant frequency posts are arranged around the lower resonant frequency posts.

17. The cavity of claim 15, wherein each of the qubits respectively incorporates its own readout resonator.

18. The cavity of claim 17, wherein the readout resonator extends into cylindrical resonators formed through the bottom plate, the cylindrical resonators being positioned respectively under each of the qubits to receive the readout resonator.

19. The cavity of claim 15, wherein the top plate, the bottom plate, and the sidewalls are made of superconducting material.

* * * * *